United States Patent
Komatsu et al.

(10) Patent No.: US 8,030,625 B2
(45) Date of Patent: Oct. 4, 2011

(54) ELECTRON BEAM WRITING METHOD, FINE PATTERN WRITING SYSTEM, METHOD FOR MANUFACTURING UNEVEN PATTERN CARRYING SUBSTRATE, AND METHOD FOR MANUFACTURING MAGNETIC DISK MEDIUM

(75) Inventors: Kazunori Komatsu, Odawara (JP); Toshihiro Usa, Odawara (JP)

(73) Assignee: Fujifilm Corporation, Tokyo (JP)

( * ) Notice: Subject to any disclaimer, the term of this patent is extended or adjusted under 35 U.S.C. 154(b) by 412 days.

(21) Appl. No.: 12/401,775

(22) Filed: Mar. 11, 2009

(65) Prior Publication Data

US 2009/0230328 A1    Sep. 17, 2009

(30) Foreign Application Priority Data

Mar. 13, 2008   (JP) .................................. 2008-063501

(51) Int. Cl.
*G21K 5/10*   (2006.01)
*H01J 37/08*  (2006.01)

(52) U.S. Cl. ............... 250/492.22; 250/396 R; 250/398; 250/492.2

(58) Field of Classification Search ............... 250/492.3, 250/396 R, 492.22
See application file for complete search history.

(56) References Cited

U.S. PATENT DOCUMENTS

| 7,868,308 | B2 * | 1/2011 | Komatsu et al. | 250/492.22 |
| 2009/0140162 | A1 * | 6/2009 | Komatsu et al. | 250/396 R |
| 2009/0140163 | A1 * | 6/2009 | Komatsu et al. | 250/396 R |
| 2009/0184265 | A1 * | 7/2009 | Komatsu et al. | 250/492.22 |
| 2009/0189094 | A1 * | 7/2009 | Komatsu et al. | 250/492.3 |
| 2009/0194711 | A1 * | 8/2009 | Usa et al. | 250/492.3 |

FOREIGN PATENT DOCUMENTS

| JP | 2000-207738 | 7/2000 |
| JP | 2003-248981 | 9/2003 |

* cited by examiner

*Primary Examiner* — Nikita Wells
*Assistant Examiner* — Johnnie Smith
(74) *Attorney, Agent, or Firm* — Young & Thompson

(57) ABSTRACT

When writing element shapes of a fine pattern on a substrate applied with a resist by scanning an electron beam thereon, ON/OFF control is performed for emitting the electron beam at a predetermined rotational position of the substrate by a blanking-OFF signal, performing writing in a rotational direction of the substrate along with the rotation of the substrate, and terminating the writing by a blanking-ON signal based on write data to perform writing for one round, and repeating the writing based on the ON/OFF control by moving the electron beam or substrate in a radial direction of the substrate and rotation control is performed for controlling the rotation speed of the rotation stage so as to be increased for inner track writing and decreased for outer track writing inversely proportional to the radius of the writing position.

9 Claims, 6 Drawing Sheets

FIG.4A
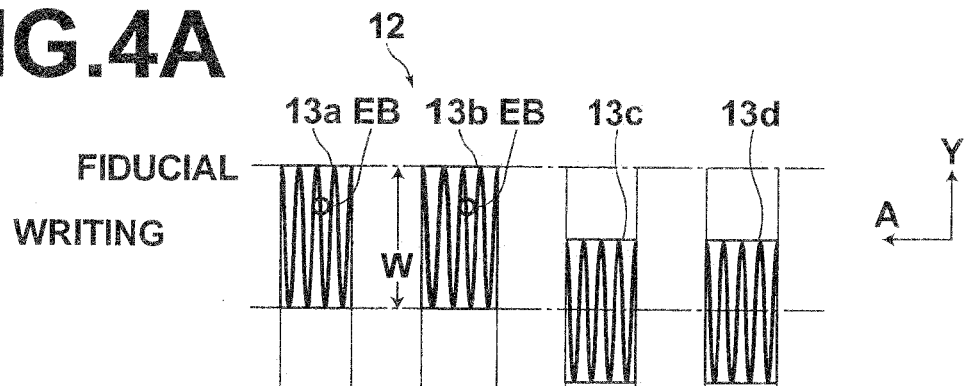
FIG.4B
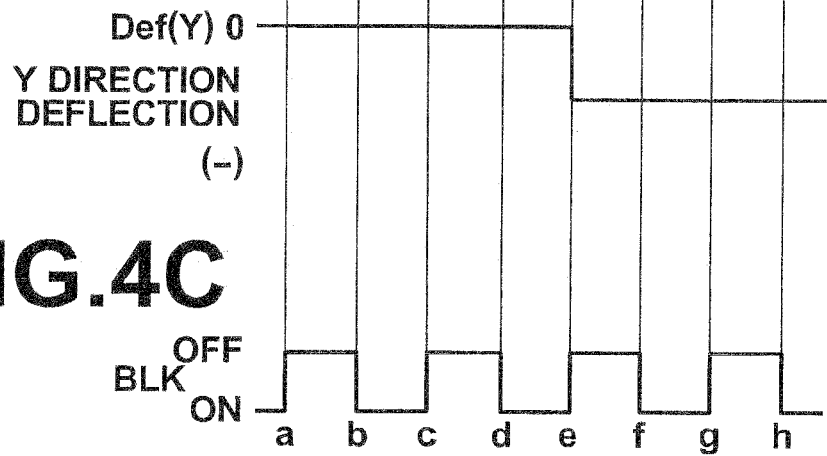
FIG.4C
FIG.4D
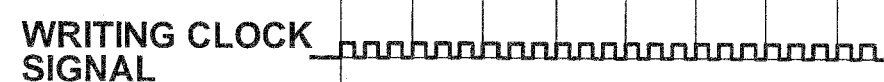
FIG.4E
FIG.4F
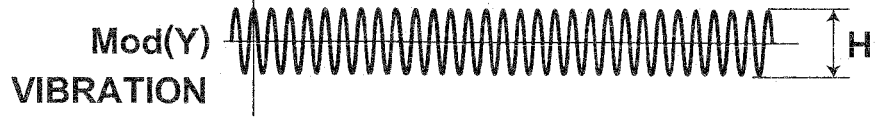

FIG.6A
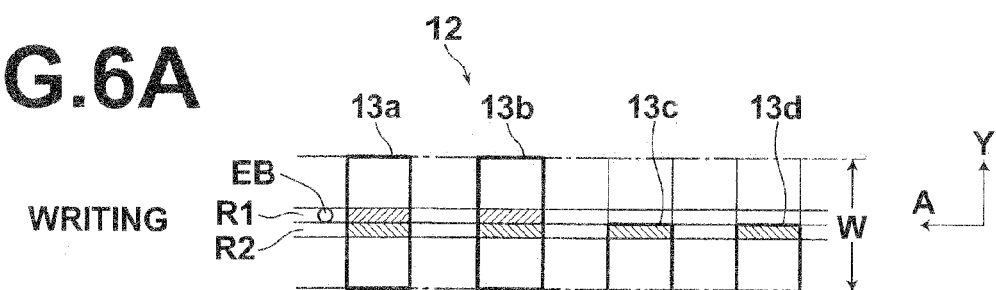
FIG.6B
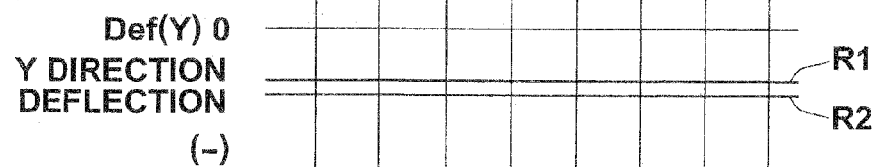
FIG.6C
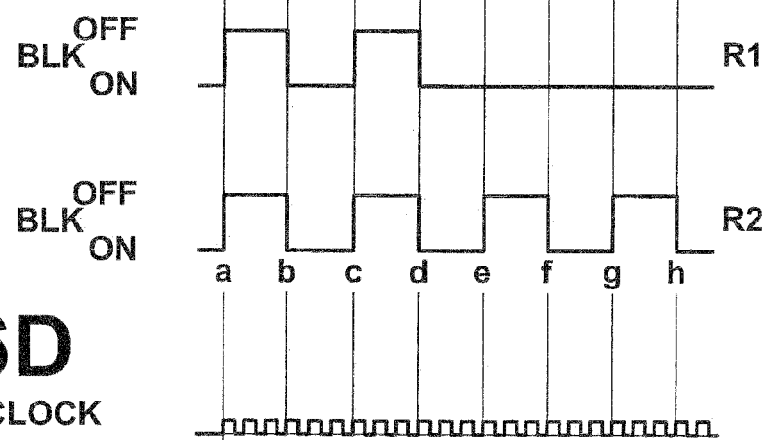
FIG.6D
WRITING CLOCK SIGNAL
FIG.6E
REFERENCE CLOCK SIGNAL

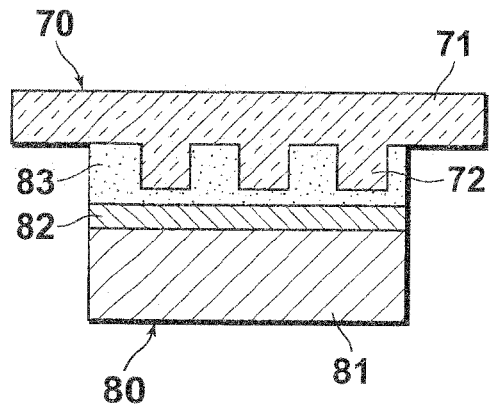
FIG.8
FIG.9A
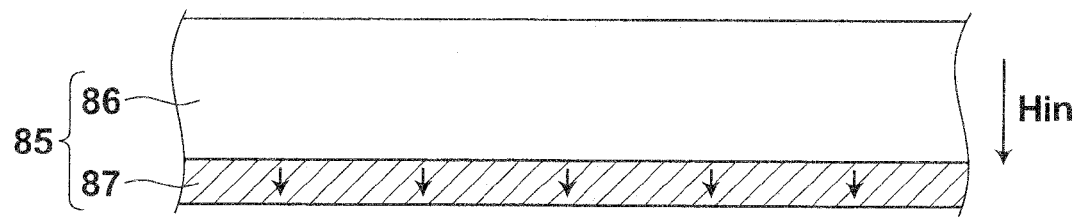
FIG.9B
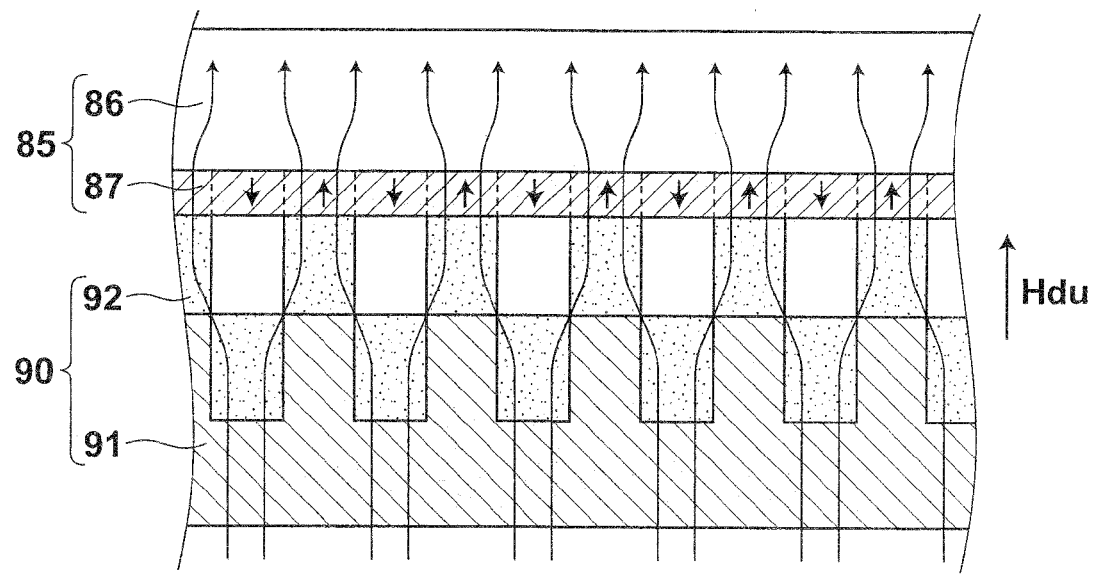

ELECTRON BEAM WRITING METHOD, FINE PATTERN WRITING SYSTEM, METHOD FOR MANUFACTURING UNEVEN PATTERN CARRYING SUBSTRATE, AND METHOD FOR MANUFACTURING MAGNETIC DISK MEDIUM

BACKGROUND OF THE INVENTION

1. Field of the Invention

The present invention relates to an electron beam writing method and a fine pattern writing system for writing a fine pattern according to a desired uneven pattern when manufacturing an imprint mold, magnetic transfer master substrate, or the like for a high density magnetic recording medium, such as a discrete track medium, bit pattern medium, or the like.

The invention also relates to a method for manufacturing an uneven pattern carrying substrate, including an imprint mold, magnetic transfer master substrate or the like, having an uneven pattern surface formed through a writing step performed by the electron beam writing method described above. The invention further relates to a method for manufacturing a magnetic disk medium having an uneven pattern transferred thereto from the imprint mold of uneven pattern carrying substrate, and a method for manufacturing a magnetic disk medium having a magnetized pattern transferred thereto from the magnetic transfer master substrate.

2. Description of the Related Art

Generally, information patterns, such as servo patterns and the like are formed on current magnetic disk media. In view of the demand of higher recording density, a discrete track medium (DTM) in which magnetic interference between adjacent data tracks is reduced by separating the tracks with a groove pattern (guard band) has been attracting wide attention. A bit pattern medium (BPM) proposed for achieving still higher density is a medium in which magnetic substances forming single magnetic domains (single-domain particles) are physically isolated and disposed regularly, and one bit is recorded in one particle.

Heretofore, fine patterns, such as servo patterns and the like, have been formed on magnetic media by uneven patterns, magnetic patterns, or the like and an electron beam writing method for patterning a predetermined fine pattern on a master of a magnetic transfer master substrate or the like has been proposed. In the electron beam writing method, a pattern is written on a substrate applied with a resist by emitting thereon an electron beam corresponding to the shape of the pattern while rotating the substrate as described, for example, in Japanese Unexamined Patent Publication No. 2000-207738 (Patent Document 1) and Japanese Unexamined Patent Publication No. 2003-248981 (Patent Document 2).

When writing fine patterns by the electron beam writing method described above, it is difficult to accurately write elements constituting each pattern on the entire surface from the inner to outer circumferential tracks.

That is, according to Patent Document 1 and Patent Document 2, inner circumferential track writing and outer circumferential track writing are performed by rotating the substrate at the same rotational speed. Consequently, the amount of radiation exposure differs for a resist having the same sensitivity between the inner circumferential track and outer circumferential track because the moving speed of the substrate relative to the electron beam is decreased in the inner circumferential track and increased in the outer circumferential track, thereby posing a problem that uniform beam exposure can not be realized.

It is difficult to control the electron gun so that the output power of electron beam is changed slightly because of structural reasons thereof. Therefore, it is necessary to control the moving speed of the substrate or beam deflection speed in the electron beam exposure according to the radius of the substrate at the electron beam emission position.

In particular, in Patent Document 1 and Patent Document 2, the writing range in a circumferential direction (rotational direction) is defined by ON/OFF control of the electron beam according to the rotational position of the substrate, that is, the beam emission position, so that it is generally the case that the substrate is rotated at a defined constant speed (number of rotations) regardless of the writing position as described above, and the ON/OFF control based on the write pattern data is performed according to an encoder pulse signal generated in association with the rotation of the substrate.

This method has an advantage that the control is simplified since the substrate is always rotated at a constant speed, that is, the rotation time of the substrate for one rotation is always the same, and both inner and outer circumferential portions can be controlled by the timing according to one type of encoder pulse. But the method has a problem that it is difficult to realize beam writing with a constant amount of radiation exposure (dose amount).

That is, when the substrate is rotated at a constant speed, that is, when the rotation time of the substrate for one rotation is the same between inner and outer circumferential writing, the relative moving speed between the emission beam and substrate surface (writing surface) is increased, causing insufficient dose amount unless the beam intensity is increased. On the other hand, the relative speed is decreased in the inner circumferential writing, causing a problem of excessive amount of dose.

Various methods for dose amount control are proposed, but as far as ON/OFF control is concerned, the dose amount control is fundamentally time control based on encoder pulse. Therefore, it is difficult to ensure favorable writing results for a material requiring strict dose amount control.

In these respects, the present invention attempts to provide an electron beam writing method capable of writing a high precision pattern by enabling accurate ON/OFF control of beam emission in a circumferential direction of the substrate for the writing of complicated patterns, such as servo patterns, over the entire surface of the substrate.

That is, the present invention performs rotation control for controlling the rotation speed of a rotation stage on which a substrate is placed so as to be decreased inversely proportional to the radius of writing position of the electron beam in ON/OFF control, thereby keeping the same rotational linear velocity for inner track writing and outer track writing to maintain the same amount of radiation exposure per unit area and to allow pattern writing with the same quality for a resist having the same sensitivity.

The change in the rotational speed in the writing between the inner and outer circumferential tracks results in that the rotation time of the rotation stage for one rotation differ from each other. In the mean time, in order to allow identical signals to be read out from inner and outer circumferential tracks of an actually used magnetic disk medium in one rotation, it is necessary to accurately form fine pattern elements according to the radial position such that the lengths thereof in a track direction become short in the inner circumferential track and long in the outer circumferential track In order to accurately control the scanning of the electron beam writing, it is necessary to control the beam scanning accurately in synchronization with the rotational movement of the rotation stage. Generally, the position and timing control is based on a clock signal generated at a constant time interval.

Where the rotation time of the rotation stage for one rotation differs in the writing between inner and outer circumferential tracks, it is necessary to finely control the length of a writing pattern in a track direction by counting different number of clocks for different tracks. In particular, for a track where the time corresponding to the writing length does not correspond to an integer multiple of the clock signal, having a fraction, the electron beam emission control is performed without regarding the fraction, causing degraded accuracy of written pattern and complicated write control. Therefore, it is also desirable to eliminate these problems.

In view of the circumstances described above, it is an object of the present invention to provide an electron beam writing method capable of writing a fine pattern, to be formed on a magnetic disk medium, over the entire surface of a substrate in a predetermined manner and highly accurately with a uniform amount of radiation exposure over the entire substrate, and a fine pattern writing system for implementing the electron beam writing method.

It is a further object of the present invention to provide a method for manufacturing an uneven pattern carrying substrate, such as an imprint mold or a magnetic transfer master substrate, having a fine pattern accurately written by an electron beam, and a method for manufacturing a magnetic disk medium using the uneven pattern carrying substrate in which an uneven pattern or a magnetic pattern is transferred from the uneven pattern carrying substrate to the magnetic disk medium.

SUMMARY OF THE INVENTION

An electron beam writing method of the present invention is a method for writing a fine pattern on a substrate applied with a resist and placed on a rotation stage by scanning an electron beam on the substrate while rotating the rotation stage, the fine pattern including elements having a track direction length greater than an emission diameter of the electron beam, wherein:

while rotating the substrate in one direction, ON/OFF control is performed with respect to the rotation of the substrate for emitting the electron beam at a predetermined rotational position of the substrate by a blanking-OFF signal, performing writing in a rotational direction of the substrate along with the rotation of the substrate, and terminating the writing by a blanking-ON signal based on write data of the fine pattern to perform writing for one round, and the writing based on the ON/OFF control is repeated by moving the electron beam or the substrate in a radial direction of the substrate, whereby the elements are written; and rotation control is performed for controlling the rotation speed of the rotation stage so as to be increased for inner track writing and decreased for outer track writing inversely proportional to the radius of the writing position in order to maintain the linear velocity of the rotation stage constant.

In the method described above, the write control signal of the electron beam is formed based on a writing clock signal generated in association with the rotation of the rotation stage, and it is preferable that the number of clocks of the writing clock signal in one rotation of the rotation, stage is set to a constant value for each track regardless of the radius of the writing position.

Further, the fine pattern may be written by writing the elements, while rotating the substrate in the one direction, by vibrating the electron beam back and forth in a radial direction of the rotation, stage and emitting the electron beam at the predetermined rotational position of the substrate along with the rotation of the substrate by the ON/OFF control.

Still further, the fine pattern may be written by writing the elements, while rotating the substrate in the one direction, by fixing the electron beam at a predetermined radial position of the substrate and emitting the electron beam at the predetermined rotational position of the substrate by the ON/OFF control, and repeating the emission of the electron beam by the ON/OFF control by moving the emission position of the electron beam in the radial direction in a next rotation of the substrate.

A fine pattern writing system of the present invention is a system for realizing the electron beam writing method described above, including a signal output unit for outputting a write data signal, and an electron beam writing unit for scanning an electron beam.

Preferably, the fine pattern writing system is structured in the following manner. That is, the electron beam writing unit includes a rotation stage movable in a radial direction while rotating a substrate applied with a resist, an electron gun that emits an electron beam, a deflection means that deflects the electron beam in a radial direction of the rotation stage, a blanking means that performs ON/OFF control of the electron beam in which the emission of the electron beam is blocked other than a writing area, and a controller that performs associated control of operation of each of the means; and the signal output unit is a unit that outputs a write data signal to the controller of the electron beam writing unit based on data corresponding to the form of a fine pattern to be written on the substrate, and wherein the controller is a controller that performs rotation control for controlling the rotation speed of the rotation stage so as to be increased for inner track writing and decreased for outer track writing inversely proportional to the radius of the writing position, and performs control for the deflection means and the blanking means based on a writing clock signal formed such that the number of clocks in one rotation of the rotation stage becomes a constant value for each track regardless of the radius of the writing position.

A method for manufacturing an uneven pattern carrying substrate is a method, including the steps of writing a desired fine pattern on a substrate applied with a resist by the electron beam writing method described above, and forming thereon an uneven pattern corresponding to the desired fine pattern. Here, the uneven pattern carrying substrate is a substrate having thereon a desired uneven pattern, such as an imprint mold for transferring the shape of the uneven pattern to a target medium, a magnetic transfer master substrate for transferring a magnetic pattern corresponding to the shape of the uneven pattern to a target medium, or the like.

A first method for manufacturing a magnetic disk medium of the present invention is a method that uses an imprint mold obtained through the steps of writing a desired fine pattern on a substrate applied with a resist by the electron beam writing method described above and forming thereon an uneven pattern corresponding to the desired fine pattern to transfer an uneven pattern corresponding to the uneven pattern formed on the surface of the mold to the medium.

A second method for manufacturing a magnetic disk medium of the present invention is a method that uses a magnetic transfer master substrate obtained through the steps of writing a desired fine pattern on a substrate applied with a resist by the electron beam writing method described above and forming thereon an uneven pattern corresponding to the desired fine pattern to transfer a magnetic pattern corresponding to the uneven pattern formed on the surface of the master substrate to the medium.

According to the electron beam writing method of the present invention, while rotating a substrate applied with a resist and placed on a rotation stage in one direction, ON/OFF control is performed with respect to the rotation of the substrate for emitting the electron beam at a predetermined rotational position of the substrate by a blanking-OFF signal, performing writing in a rotational direction of the substrate along with the rotation of the substrate, and terminating the writing by a blanking-ON signal based on write data of the fine pattern to perform writing for one round, and the writing based on the ON/OFF control is repeated by moving the electron beam or the substrate in a radial direction of the substrate, whereby the elements are written, and rotation control is performed for controlling the rotation speed of the rotation stage so as to be increased for inner track writing and decreased for outer track writing inversely proportional to the radius of the writing position in order to maintain the linear velocity of the rotation stage constant. This allows inner track writing and outer track writing of a fine pattern to be performed with a uniform amount of radiation exposure, and the fine pattern may be written rapidly and highly accurately over the entire surface of the substrate, resulting in improved writing efficiency and reduced writing time.

Where the write control signal of the electron beam is formed based on a writing clock signal generated in association with the rotation of the rotation stage, and the number of clocks of the writing clock signal in one rotation of the rotation stage is set to a constant value for each track regardless of the radius of the writing position, control according to the radial position may be performed easily and highly accurately.

Further, where the fine pattern is written by writing the elements, while rotating the substrate in one direction, by vibrating the electron beam back and forth in the radial direction of the rotation stage and emitting the electron beam at the predetermined rotational position of the substrate along with the rotation of the substrate by the ON/OFF control, elements of the fine pattern in one track may be written rapidly and highly accurately in one rotation.

Further, the fine pattern may be written by writing the elements, while rotating the substrate in one direction, by fixing the electron beam at a predetermined radial position and emitting the electron beam at the predetermined rotational position of the substrate by the ON/OFF control, and repeating the emission of the electron beam by the ON/OFF control by moving the emission position of the electron beam in the radial direction in a next rotation of the substrate.

In the mean time, the fine pattern writing system for realizing the electron beam writing method of the present invention includes a signal output unit for outputting a write data signal and an electron beam writing unit for scanning an electron beam, so that a desired fine pattern may be written rapidly and highly accurately, resulting in improved writing efficiency and reduced writing time.

In particular, a preferable system as the fine pattern writing system may be built in the following manner. That is, the electron beam writing unit includes a rotation stage movable in a radial direction while rotating a substrate applied with a resist, an electron gun that emits an electron beam, a deflection means that deflects the electron beam in a radial direction of the rotation stage, a blanking means that performs ON/OFF control of the electron beam in which the emission of the electron beam is blocked other than a writing area, and a controller that performs associated control of operation of each of the means. The signal output unit is a unit that outputs a write data signal to the controller of the electron beam writing unit based on data corresponding to the form of a fine pattern to be written on the substrate. Here, the controller is a controller that performs rotation control for controlling the rotation speed of the rotation stage so as to be increased for inner track writing and decreased for outer track writing inversely proportional to the radius of the writing position, and performs control for the deflection means and the blanking means based on a writing clock signal formed such that the number of clocks in one rotation of the rotation stage becomes a constant value for each track regardless of the radius of the writing position.

According to the method for manufacturing an uneven pattern carrying substrate of the present invention, the method includes the steps of writing a desired fine pattern on a substrate applied with a resist by the electron beam writing method described above and forming an uneven pattern thereon corresponding to the desired fine pattern. Thus, a substrate having thereon a highly accurate uneven pattern may be obtained easily.

According to the first method for manufacturing a disk medium of the present invention, a magnetic disk medium is manufactured using an imprint mold obtained through the steps of writing a desired fine pattern on a substrate applied with a resist by the electron beam writing method described above and forming thereon an uneven pattern corresponding to the desired fine pattern to transfer an uneven pattern corresponding to the uneven pattern provided on the surface of the mold to the magnetic disk medium. In the case of imprint mold, when performing shape patterning using imprint technology, the mold is pressed onto the surface of a resin layer serving as a mask in the manufacturing process of the magnetic disk medium and the pattern is transferred to the surface of the medium at a time, whereby a magnetic disk medium having excellent properties, such as a discrete track medium or a bit pattern medium, may be manufactured easily.

According to the second method for manufacturing a disk medium of the present invention, a magnetic disk medium is manufactured using a magnetic transfer master substrate obtained through the steps of writing a desired fine pattern on a substrate applied with a resist by the electron beam writing method described above and forming thereon an uneven pattern corresponding to the desired fine pattern to magnetically transfer a magnetic pattern corresponding to the uneven pattern formed on the surface of the master substrate to the magnetic disk medium. In the case of magnetic transfer master substrate, the substrate has thereon a fine pattern of a magnetic layer, so that a magnetic recording medium having excellent properties may be manufactured easily by bringing the master substrate into contact with the magnetic recording medium and applying a magnetic field thereto using magnetic transfer technology, and transfer forming a magnetic pattern corresponding to the pattern of the magnetic layer of the master substrate on the magnetic recording medium.

BRIEF DESCRIPTION OF THE DRAWINGS

FIG. 4A is an enlarged schematic view illustrating a first writing method for writing elements constituting a fine pattern in an inner circumferential track.

FIGS. 4B to 4F illustrate various signals, including a deflection signal and the like, used in the first writing method shown in FIG. 4A.

FIG. 6A is an enlarged schematic view illustrating a second writing method for writing elements constituting a fine pattern in an inner circumferential track corresponding to those shown in FIG. 4A.

FIGS. 6B to 6E illustrate various signals, including a deflection signal and the like, used in the second writing mode shown in FIG. 6A.

FIG. 8 is a schematic cross-sectional view illustrating a transfer-forming process of a fine pattern on a magnetic disk medium using an imprint mold having a fine pattern written by the electron beam writing mode.

FIGS. 9A and 9B are schematic cross-sectional views illustrating a transfer-forming process of a magnetic pattern on a magnetic disk medium using a magnetic transfer master having a fine pattern written by the electron beam writing mode.

DESCRIPTION OF THE PREFERRED EMBODIMENTS

Figure 1:
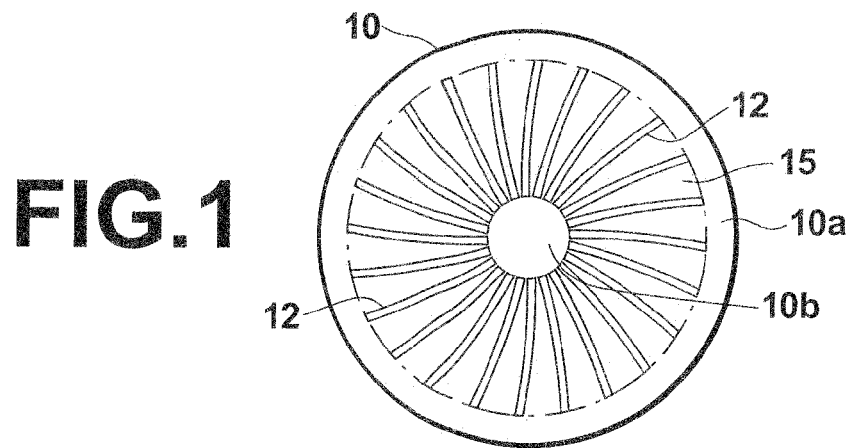
FIG. 1 illustrates an example fine pattern in plan view to be written on a substrate by an electron beam writing method of the present invention.
Figure 2:
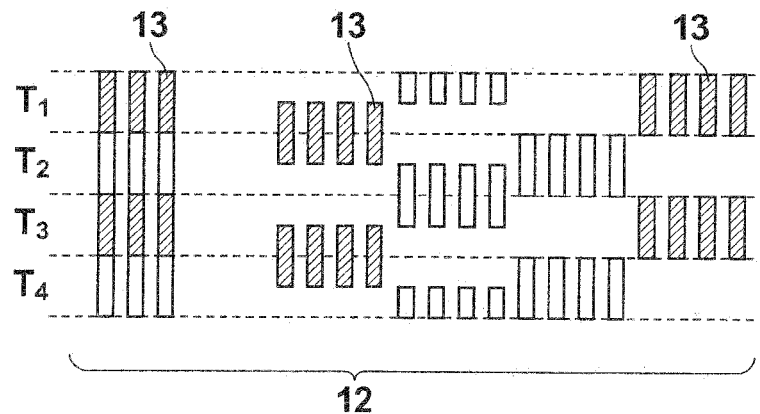
FIG. 2 is a partially enlarged view of the fine pattern.
Figure 3:
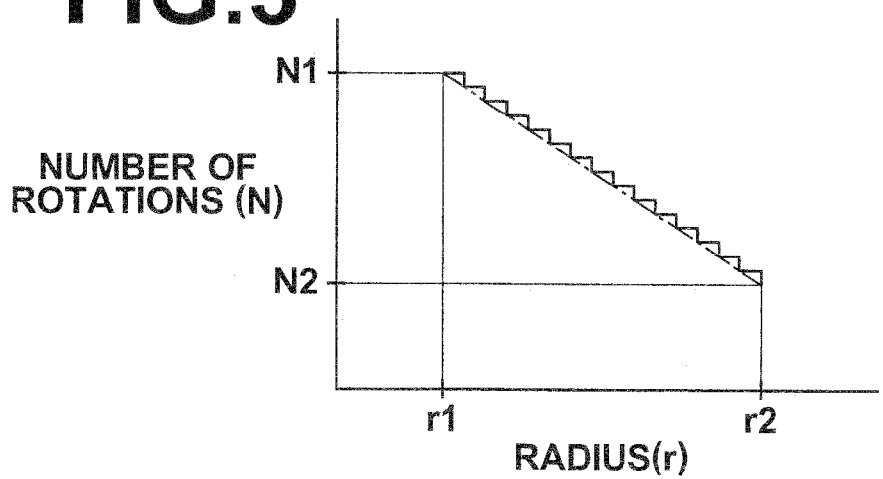
FIG. 3 is a characteristic view illustrating the relationship between the radius of the writing position and rotational speed of a substrate.
Figure 5A:
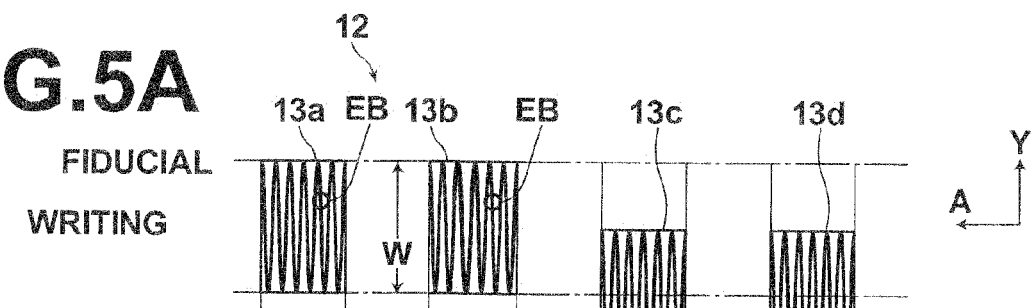
FIG. 5A is an enlarged schematic view of the first writing method for writing elements constituting a fine pattern in an outer circumferential track.
Figure 7A:
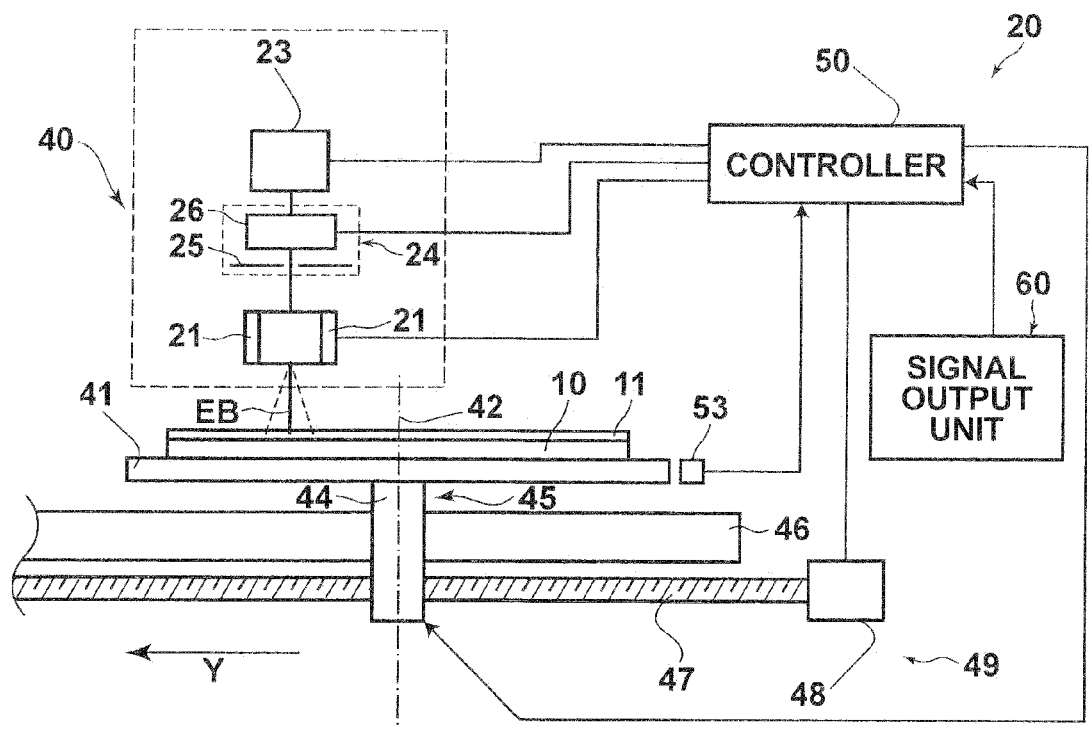
FIG. 7A is a relevant side view of a fine pattern writing system according to an embodiment for implementing the electron beam writing mode of the present invention.
Figure 7B:
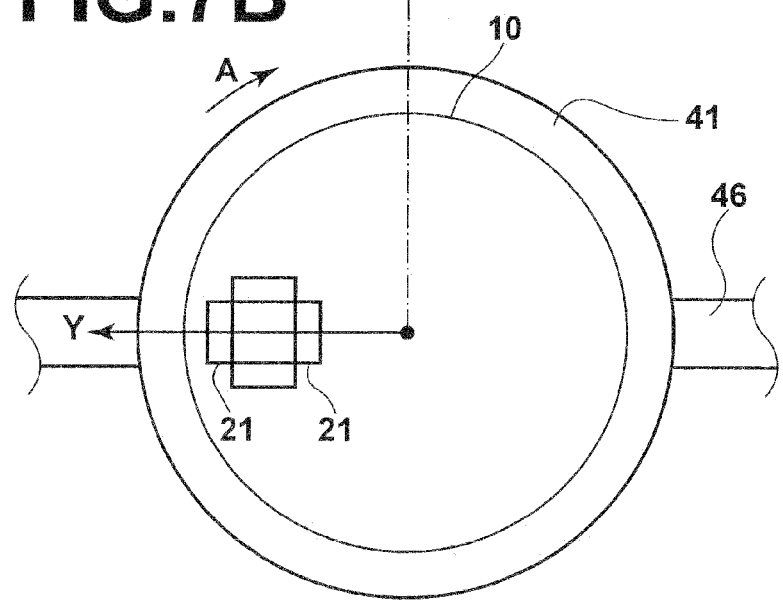
FIG. 7B is a partial plan view of the fine pattern writing system shown in FIG. 7A.

Hereinafter, exemplary embodiments of the present invention will be described in detail with reference to the accompanying drawings. FIG. 1 illustrates an example fine pattern in plan view to be written on a substrate by an electron beam writing method of the present invention. FIG. 2 is a partially enlarged view of the fine pattern. FIG. 3 is a graph illustrating the relationship between the radius of the writing position and rotational speed of a substrate. FIG. 4A is an enlarged schematic view illustrating a first writing method for writing elements constituting a fine pattern in an inner circumferential track. FIGS. 4B to 4F illustrate various signals, including a deflection signal and the like, used in the first writing mode shown in FIG. 4A. FIG. 5A is an enlarged schematic view illustrating the first writing method for writing elements constituting a fine pattern which is identical to that shown in FIG. 4A in an outer circumferential track. FIGS. 5B to 5F illustrate various signals, including a deflection signal and the like, used in the first writing mode shown in FIG. 5A. FIG. 6A is an enlarged schematic view illustrating a second writing method for writing elements constituting a fine pattern in an inner circumferential track corresponding to those shown in FIG. 4A. FIGS. 6B to 6E illustrate various signals, including a deflection signal and the like, used in the second writing method shown in FIG. 6A. FIG. 7A is a relevant side view of a fine pattern writing system according to an embodiment for implementing the electron beam writing mode of the present invention and FIG. 7B is a partial plan view of the fine pattern writing system shown in FIG. 7A.

As illustrated in FIGS. 1 and 2, a fine pattern of fine uneven shapes for a magnetic disk medium includes servo patterns 12 formed in a plurality of servo areas, and data area 15 is provided between servo areas 12. The fine pattern is formed on an annular region of disk-shaped substrate 10 (circular substrate) excluding outer circumferential portion 10a and inner circumferential portion 10b.

Servo patterns 12 are formed in elongated areas substantially radially extending from the center to each sector on concentric tracks of substrate 10 at regular intervals. In this example, servo patterns 12 are formed in contiguous curved radials in the radial direction. As shown in FIG. 2, which is a partially enlarged view of the servo patterns, fine rectangular servo elements 13 corresponding, for example, to preamble, address, and burst signals are disposed on concentric tracks T1 to T4. One servo element 13 has a width of one track width and a track direction length greater than the emission diameter of the electron beam. Some of servo elements 13 of burst signals are shifted by a half track width and extending over the adjacent track.

In the case of the first writing method shown in FIG. 4A, servo elements 13 for one track are written during one rotation of substrate 10. When first track T1 or third track T3 shown in FIG. 2 is written, hatched elements 13 are sequentially written. Servo elements 13 shifted by a half track width and extend over adjacent track T2 or T3 are written at a time by shifting the writing fiducial by a half track width without dividing them into halves.

For a discrete track medium, which has received attention in recent years, groove patterns extending in the track direction are concentrically formed in a guard band section between each data track in data areas 15 so as to separate each of adjacent tracks T1 to T4 by the grooves, in addition to servo patterns 12. The groove patterns are written by separate write control.

When writing each servo element 13 of each servo pattern 12, substrate 10 applied with resist 11 is placed on rotation stage 41 (FIG. 7) to be described later, and while substrate 10 is rotated, elements 13 are sequentially scanned with electron beam EB to radiation expose resist 11 one track at a time from a track on the inner circumferential side to a track on the outer circumferential side or vice versa.

FIG. 3 illustrates the relationship in rotational speed (number of rotations) of substrate 10 between the writing on an inner circumferential track and writing on an outer circumferential track in pattern writing on substrate 10. In the basic characteristic represented by the chain line, rotation control is performed such that the number of rotations N2 for the outermost track (radius r2) is decreased inversely proportional to the radius with respect to the number of rotations N1 for the innermost track (radius r1). In practice, the number of rotations N is not change-controlled for each track, but the rotation control is performed in a stepwise manner when rotation stage 41 is mechanically moved in the radial direction after a plurality of tracks (e.g., 8 tracks) is written according to the deflectable range of electron beam EB in the radial direction to change the number of rotations N of rotation stage 41 in association with the mechanical movement thereof, as shown by the solid line.

In this way, the number of rotations N of rotation stage 41 is controlled so as to be decreased when an outer circumferential track is written and increased when an inner circumferential track is written in order to maintain the linear velocity constant over the entire writing area of substrate 10 including an inner side region and an outer side region when a writing region in the writing area of substrate 10 is moved in the radial direction, that is, with respect to track migration. This is advantageous since a uniform amount of dose and accuracy of the writing position may be ensured in the writing by electron beam EB.

FIGS. 4A to 4F and FIGS. 5A to 5F illustrate the first electron beam writing method of the present invention. In the present embodiment, in-track servo elements 13a and 13b of servo pattern 12, then servo elements 13c and 13d extending over the adjacent track are sequentially written at a time during one rotation of substrate 10 (rotation stage 41). That is, while rotating substrate 10 in "A" direction, servo elements 13a to 13d are sequentially written at a time at predetermined phase positions on concentric tacks (track width: W) which, when viewed microscopically, extends linearly by scanning electron beam EB having a small diameter so as to completely fill the shapes thereof.

FIGS. 4A to 4F illustrate writing in an inner circumferential track, in which the length of the servo elements 13a to 13d in a track direction is short FIGS. 5A to 5F illustrate writing in an outer circumferential track, in which the length of the servo elements 13a to 13d in a track direction is long as the length of the circumference becomes long, although track width W is the same. In both cases, signals read out from corresponding one of servo elements 13a to 13d are the same when rotationally driven as a finished product of magnetic disk medium.

The recording mode of servo patterns 12 described above is a constant angular velocity (CAV) mode, in which writing is performed such that the length of element 13 in the track direction is long in a track on the outer circumferential side and short in a track on the inner circumferential side according to the variation in the sector length between the inner and outer circumferences.

The scanning of electron beam EB is performed in the following manner. That is, while electron beam EB having a smaller beam diameter than a minimum track direction length of servo elements 13a to 13d is ON/OFF emitted through ON/OFF operation of blanking means 24, to be described later, according to the writing area, electron beam EB is rapidly vibrated back and forth in radial direction Y at a constant amplitude according to the rotational speed of substrate 10 (rotation stage 41) as shown in FIGS. 4A and 5A. In this way, electron beam EB is scanned so as to completely fill servo elements 13a to 13d, whereby the elements are written. Following the writing of in-track servo elements 13a and 13b, servo elements 13c and 13d extending over the adjacent track are written in the same manner by shifting the writing fiducial in radial direction Y by a half track width.

Figure 5B:
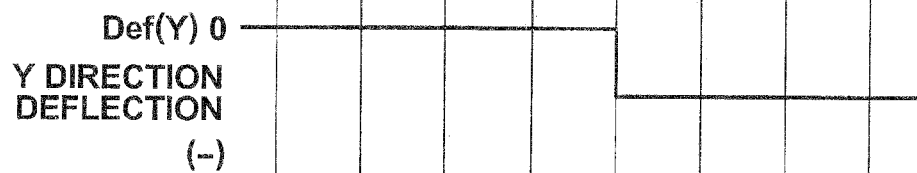
FIGS. 5B to 5F illustrate various signals, including a deflection signal and the like, used in the first writing method shown in FIG. 5A.
Figure 5C:
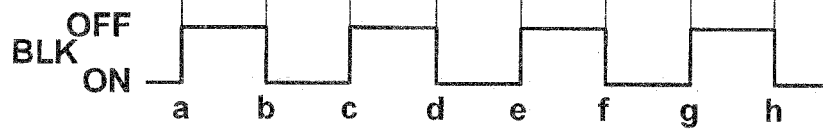
Figure 5D:
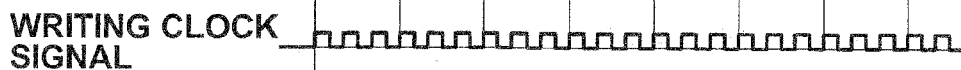
Figure 5E:
Figure 5F:
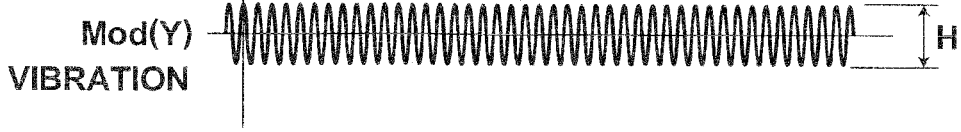

FIGS. 4A and 5A illustrate the writing operation of electron beam EB in radial direction Y (toward the outer circumferential direction) and rotational direction A. FIGS. 4B and 5B illustrate deflection signal Def(Y) in radial direction Y, FIGS. 4C and 5C illustrate ON/OFF control of blanking signal BLK, FIGS. 4D and 5D illustrate writing clock signal, FIGS. 4E and 5E illustrate constant reference clock signal, and FIGS. 4F and 5F illustrate vibration signal Mod(Y) in radial direction Y. The horizontal axes of FIGS. 4A and 5A represent the phase of substrate 10, and those of FIGS. 4B to 4F and FIGS. 5B to 5F represent time.

The reference clock signal shown in FIG. 4E or 5E is a constant clock signal, which does not change under any circumstances, generated in controller 50, to be described later. The writing clock signal shown in FIG. 4D or 5D is based on the reference clock signal, and the clock width (clock length) is controlled according to change in the number of rotations N such that the number of clocks per rotation of rotation stage 41 remains the same even when the number of rotations N of rotation stage 41 is changed between the time when an inner circumferential track is written and the time when an outer circumferential track is written as illustrated in FIG. 3.

That is, the clock width is changed according to radius "r" for every predetermined number of tracks so as to become narrow in an inner circumferential track shown in FIG. 4A and wide in an outer circumferential track shown in FIG. 5A. Then, the dimensional and temporal widths in circumferential direction (rotational direction A) are defined by the number of clocks of the writing clock signal, and each of servo elements 13a to 13d is written with the same number of clocks in FIGS. 4A and 5A. This causes the number of writing clocks to become the same between the inner and outer circumferential sides at the same angle (phase), whereby analogous patterns may be written easily. Unlike the above, where the clock width is maintained the same between the inner and outer circumferences, the width of an element on a certain track may not possibly correspond to an integer multiple of the clock width, whereas, in the present invention, the element width is always maintained to an integer multiple of the clock width so that servo elements with subtly changing pattern widths may be written easily.

A first writing example of servo elements 13 will now be described in detail with reference to FIGS. 4A to 4F and FIGS. 5A to 5F. First, at point "a", blanking signal BLK (FIG. 4C or 5C) is turned OFF to emit electron beam EB and the writing of servo elements 13a is started. While vibrating electron beam EB at the fiducial position back and forth in radial direction Y by vibration signal Mod (Y) (FIG. 4F or 5F) the emission position of electron beam EB is moved in the circumferential direction by the rotation of substrate 10 in "A" direction, whereby electron beam EB is scanned so as to completely fill rectangular servo element 13a. Then, at point "b", blanking signal BLK is turned ON to terminate the emission of electron beam EB and the writing of element 13a is completed.

Next, as substrate 10 is rotated further and reaches point "c", the writing of servo element 13b is started in the same manner as described above, and the writing is performed in the same manner based on the same ON/OFF control, and the writing of servo element 13b is completed at point "d".

Then, at point "e", the fiducial position of deflection signal. Def(Y) is moved in a radial direction (−Y) by a half track. Then, from that fiducial position, while vibrating electron beam EB back and forth in radial direction Y by vibration signal Mod (Y) (FIG. 4F or 5F), the emission position of electron beam EB is moved in the circumferential direction by the rotation of substrate 10 in "A" direction, whereby electron beam EB is scanned so as to completely fill rectangular servo element 13c. Then, at point "f", blanking signal BLK is turned ON to terminate the emission of electron beam EB and the writing of element 13c is completed in the same manner as described above.

Next, as substrate 10 is rotated further and reaches point "g", the writing of servo element 13d is started in the same manner as described above, and the writing is performed in the same manner based on the same ON/OFF control, and the writing of servo element 13d is completed at point "h".

As described above, the write control signals shown in FIGS. 4B to 4C or FIGS. 5B to 5C are generated based on the writing clock signal shown in FIG. 4D or 5D, and ON/OFF control of the blanking signal shown in FIG. 4C or 5C is implemented according to signal generation timing of the writing clock signal.

Note that when writing servo elements 13, accurate positioning is performed at a plurality of writing start points, such as point "a" in FIG. 4C and the like, based on the encoder pulse signal to improve accuracy of the forming position of the servo patterns 12 in one round.

After writing one track for one round is completed, electron beam EB is moved to the next track and the writing is performed in the same manner as described above, whereby desired fine patterns 12 are written over the entire writing area of substrate 10. The track migration of electron beam EB is performed by linearly moving rotation stage 41, to be described later, in radial direction Y. As described above, the movement of the rotation stage may be performed for the writing of every plurality of tracks according to the deflectable range of electron beam EB in radial direction Y or for writing of each track.

When the outer track writing shown in FIGS. 5A to 5F is compared to the inner track writing shown in FIGS. 4A to 4F, each of the signals shown in FIGS. 5B and 5C is set such that the length thereof in the track direction becomes longer by a predetermined factor. The oscillation signal shown in FIG. 5F is set to the same amplitude H and frequency, and the writing width corresponding to track width W in radial direction Y is defined by amplitude H of back and forth vibration of electron beam EB in radial direction Y.

In the mean time, the reference clock signal shown in FIG. 5E is generated constantly at the same time interval, and the clock width of writing clock signal shown in FIG. 5D is adjusted so as to become the same number of clocks in one round according to the radius based on the reference clock signal. That is, the clock width is increased by a factor identical to that of the signals shown in FIGS. 5B and 5C. Then, the ON/OFF timings of the respective signals and signal shapes are set by counting the number of clocks of the writing clock signal. For example, it is preferable that servo elements 13 of servo pattern 12 be written at a rate of 10 to 30 clocks.

As described above, the clock width of the writing clock signal shown in FIG. 4D or 5D becomes wide in an outer circumferential track and narrow in an inner circumferential track while the number of rotations N of rotation stage 41 becomes small in an outer circumferential track and large in an inner circumferential track, which are changed at the same time in synchronization with each other. A slight change in the writing track position, that is, radial position "r" during the same number of rotations N does not change the number of clocks in one rotation, so that elements having substantially the same shape may be written at the same phase position through control by the same number of writing clocks. Here, the relative moving speed of resist 11 with respect to electron beam EB differs depending on the radial position and becomes slightly faster in an outer circumference, whereby the amount of dose of unit area is changed. But, the signal lengths of the written elements depend on the rotational speed of substrate 10, so that they become substantially the same, and slight change in the writing track position may be compensated for by the sensitivity of the resist, signal accuracy, and the like without changing the number of rotations N and the width of the writing clock signal. Therefore, these signals can be actually used as recorded information without any problem and it is not necessary to perform change control of the number of rotations N and writing clock width for the writing of each track but, for example, the writing of every 8 tracks as described above.

The intensity of electron beam EB is set to a value which is sufficient to expose resist 11 by the rapid vibration writing of servo elements 13.

Next, an embodiment of a second writing method of the present invention will be described. FIG. 6A illustrates writing operation of electron beam EB in radial direction Y (toward the outer circumferential direction) and rotational direction A. FIG. 6B illustrates deflection signal Def(Y) in radial direction Y, FIG. 6C illustrates ON/OFF control of blanking signal BLK, FIG. 6D illustrates writing clock signal set so as to become the same number of clocks for one rotation as in the above, and FIG. 6E illustrates constant reference clock signal. The horizontal axis of FIG. 6A represents the phase of substrate 10, and those of FIGS. 6B to 6E represent time.

The second writing method is a method based on basic ON/OFF control in which electron beam EB is shifted in radial direction Y by one beam width with respect to each rotation of substrate 10, without back and forth vibration in the radial direction as in the first writing method.

That is, the emission of electron beam is ON/OFF controlled in synchronization with the rotation of substrate 10 according to the positions (phases) of servo elements 13 to write servo elements 13 of one beam width for one round. Then, in the next rotation of substrate 10, the emission position of electron beam EB in radial direction Y is shifted one pitch by one beam width and exposure writing of electron beam EB is performed through the same ON/OFF control. This is repeated to perform the writing over the entire surface of substrate 10 from the inner circumference to the outer circumference or vice versa together with the movement of rotation stage 41 in a radial direction.

FIGS. 6A to 6E illustrate the writing in the inner circumferential track corresponding to FIGS. 4A to 4F. These drawings illustrate the writing aspect of two consecutive rotations of substrate 10, rotations R1 and R2. In rotation R1, deflection signal Def(Y) in radial direction Y shown in FIG. 6B is fixed by deflection signal R1 having a constant voltage corresponding to the writing radial position, the emission of electron beam EB is intermittently interrupted by ON/OFF control of blacking signal BLK shown in FIG. 6C as substrate 10 is rotated in "A" direction, whereby exposure writing is performed.

More specifically, at point "a", blanking signal BLK is turned OFF to emit electron beam EB, whereby the writing of servo element 13a is started. The writing position is moved in the circumferential direction (track direction) by the movement of the emission position of electron beam EB due to the rotation of substrate 10 in "A" direction, and blanking signal BLK is turned ON at point "b" to terminate the emission of electron beam EB, whereby the writing of servo element 13a for one beam width is completed.

Then, as substrate 10 is rotated further and reaches point "c", the writing of the next servo element, servo element 13b, is started in the same manner as described above, and the writing is performed in the same manner based on the same ON/OFF control, and the writing of servo element 13b for one beam width is completed at point "d". In rotation R1, subsequent servo elements 13c and 13d are not written, since the beam width does not include the shapes of the elements.

Following this, in the second rotation, rotation R2, deflection signal Def(Y) shown in FIG. 6B is shifted one pitch by one beam width and fixed by deflection signal R2 having a constant voltage corresponding to the writing radial position. As substrate 10 is rotated in "A" direction, blanking signal BLK is turned OFF at point "a" to emit electron beam EB, whereby the writing of next one beam width for servo element 13a is started. The writing position is moved by the rotation of substrate 10 in "A" direction, and blanking signal BLK is turned ON at point "b" to terminate the emission of electron beam EB, whereby the writing of servo element 13a for the next one beam width is completed. Then, as substrate 10 is rotated further and reaches point "c", the writing of the next servo element, servo element 13b, is started in the same manner as described above, and the writing is performed in the same manner based on the same ON/OFF control, and the writing of servo element 13b for the next one beam width is completed at point "d".

Following this, blanking signal BLK shown in FIG. 6C is turned OFF at point "e" to emit electron beam EB, whereby the writing of servo element 13c for initial one beam width is started. The writing position is moved by the rotation of substrate 10 in "A" direction, and blanking signal BLK is turned ON at point "f" to terminate the emission of electron beam EB, whereby the writing of servo element 13c for the one beam width is completed. Then, as the substrate 10 is further rotated and reaches point "g", the writing of servo element 13d for the initial one beam width is started in the same manner as described above, and the writing is performed in the same manner based on the same ON/OFF control, and the writing of servo element 13d for the one beam width is completed at point "h".

The movement of the emission position of electron beam EB in the radial direction within at least one track is implemented by the deflection operation of electron beam EB, and the movement to the next track is implemented by the deflection operation of electron beam EB or linear movement of rotation stage 41 in radial direction Y.

In the second writing method, illustration of the writing in an outer circumferential track is omitted, but servo elements having a longer length in the track direction corresponding to those shown in FIG. 5A are written based on the identical ON/OFF control by the rotation control of the writing clock signal.

In order to write each of servo elements 13 of servo pattern 12 described above, electron beam EB is scanned in the manner as described above. A write data signal for performing the scan control of electron beam EB is sent from signal output unit 60, to be described later (FIG. 7) to controller 50 of electron beam writing unit 40. The timing and phase of the write data signal are controlled based on an encoder pulse generated according to the rotation of rotation stage 41 and the writing clock signal.

In order to perform the writing described above, fine pattern writing system 20 shown in FIGS. 7A and 7B is used. Fine pattern writing system 20 includes electron beam writing unit 40 and signal output unit 60. Electron beam writing unit 40 includes rotation stage unit 45 having rotation stage 41 and spindle motor 44 having a motor axis aligned with central axis 42 of rotation stage 41; shaft 46 passing through a portion of rotation stage unit 45 and extending in radial direction Y of rotation stage 41; and linear moving means 49 for moving rotation stage unit 45 along shaft 46. Rod 47 with accurate threading and disposed parallel to shaft 46 is screwed to a portion of rotation stage unit 45. Rod 47 is rotatable in the forward and reverse directions by pulse motor 48, and linear moving means 49 of rotation stage unit 45 is formed by rod 47 and pulse motor 48. Further, encoder 53 that generates encoder pulses at regular intervals and predetermined rotation phases by reading encoder slits is installed for detecting the rotation of rotation stage 41, and the encoder pulse signal is outputted to controller 50. Controller 50 further includes a clock unit (riot shown) therein that generates the reference clock signal in the timing control.

Electron beam writing unit 40 further includes electron gun 23 that emits electron beam EB, deflection means 21 that deflects electron beam EB in radial direction Y, as well as microscopically vibrating the beam back and forth in radial direction Y with a predetermined amplitude (back and forth vibration is not required in the second writing method), and aperture 25 and blanking 26 (deflector) as blanking means 24 for turning the emission of electron beam EB ON and OFF. Electron beam EB emitted from electron gun 23 is directed to substrate 10 through deflection means 21, a not shown lens, and the like.

Aperture 25 of blanking means 24 has a through hole in the center for passing electron beam EB, and blanking 26 operates according to input of ON/OFF signals, in which it passes electron beam EB through the through hole of aperture 25 to emit it on the substrate during OFF-signal without deflecting the beam, while it blocks electron beam EB with aperture 25 by deflecting the beam so as not to pass through the through hole during ON-signal, so that electron beam EB is not emitted on the substrate. Then, while each element 13 is being written, OFF-signal is inputted to emit electron beam EB, and ON-signal is inputted during a migration period between elements 13 to block electron beam EB so that writing is not performed.

Drive control of spindle motor 44, that is, the rotational speed of rotation stage 41, pulse motor driving, that is, the linear movement of linear moving means 49, modulation of electron beam EB, control of deflection means 21, ON/OFF control of blanking 26 of blanking means 24, and the like are performed based on control signals outputted from controller 50 that functions as the control means.

Signal output unit 60 stores therein write data of a fine pattern, such as servo patterns 12 and outputs the write data signal to controller 50. Controller 50 performs the associated control described above based on the write data signal, and electron beam writing unit 40 writes servo patterns 12 of the fine pattern on the entire surface of substrate 10.

Substrate 10 to be placed on rotation stage 41 is made of, for example, silicon, glass, or quartz and a positive or negative electron beam writing resist 11 is applied on a surface thereof in advance. Preferably, the power and beam diameter are controlled taking into account the sensitivity of electron beam writing resist 11 and the shape of each of elements 13.

FIG. 8 is a schematic cross-sectional view illustrating a process of transfer forming a fine uneven pattern using imprint mold 70 (uneven pattern carrying substrate) having a fine pattern written by the electron beam writing method using fine pattern writing system 20.

Imprint mold 70 is obtained in the following manner. That is, resist 11 (not shown in FIG. 8) is applied on a surface of substrate 71 made of a transparent material and servo patterns 12 are written thereon. Thereafter, resist 11 is processed to form an uneven pattern of the resist on substrate 71. Substrate 71 is etched with the patterned resist as the mask, and then the resist is removed, whereby imprint mold 70 having fine uneven pattern 72 formed thereon is obtained. As an example, fine uneven pattern 72 includes servo patterns and groove patterns for a discrete track medium.

Magnetic disk medium 80 is formed by imprint method using imprint mold 70. Magnetic disk medium 80 includes substrate 81 on which magnetic layer 82 is stacked and resist resin layer 83 for forming a mask layer is provided thereon. The uneven shape of fine uneven pattern 72 is transfer formed by pressing fine uneven pattern 72 of imprint mold 70 against resist resin layer 83 and solidifying resist resin layer 83 by ultraviolet radiation. Thereafter, magnetic layer 82 is etched based on the uneven shape of resist resin layer 83 to form magnetic disk medium 80 of discrete track medium with the fine uneven pattern formed on magnetic layer 82.

The above description is a manufacturing process of a discrete track medium, but a bit pattern medium may also be manufactured through an identical process.

FIGS. 9A, 9B are schematic cross-sectional views illustrating a magnetic transfer process of a magnetic pattern to magnetic disk medium 85 of the present invention using magnetic transfer master substrate 90 (uneven pattern carrying substrate) having a fine pattern written by the electron beam writing method using fine pattern writing system 20.

The manufacturing process of magnetic transfer master substrate 90 is substantially identical to that of imprint mold 70. Substrate 10 to be placed on rotation stage 41 is made of, for example, a silicon, glass, or quartz disk, and positive or negative electron beam writing resist 11 is applied thereon. Then resist 11 is scanned with an electron beam to write a desired pattern thereon. Thereafter, resist 11 is processed to obtain substrate 10 having an uneven pattern of the resist, which is an original master of magnetic transfer master substrate 90.

Next, a thin conductive layer is formed on the surface of the uneven pattern formed on the surface of the original master, and electroforming is performed thereon to obtain substrate 91 having an uneven pattern of metal casting. Thereafter, substrate 91 having a predetermined thickness is peeled off from the original master. The uneven pattern on the surface of substrate 91 is a reverse pattern of the uneven shape of the original master.

After grinding the rear surface of substrate 91, magnetic layer 92 (soft magnetic layer) is stacked on the uneven pattern to obtain magnetic transfer master substrate 90. The shape of a convex portion or concave portion of the uneven pattern on the surface of substrate 91 depends on the uneven pattern of the resist of the original master.

A magnetic transfer method using magnetic transfer master substrate 90 manufactured in the manner as described above will now be described. Magnetic disk medium 85 which is a medium to which information is transferred is, for example, a hard disk, flexible disk, or the like which includes substrate 86 having magnetic recording layer 87 formed on either one of the sides or on both sides. Here, it is assumed to be a vertical magnetic recording medium in which the easy direction of magnetization of magnetic recording layer 87 is perpendicular to the recording surface.

As illustrated in FIG. 9A, initial DC field Hin is applied to magnetic disk medium 85 in a direction perpendicular to the track surface in advance to initially DC-magnetize magnetic recording layer 87. Thereafter, as illustrated in FIG. 9B, magnetic transfer is performed by bringing the surface of magnetic disk medium 85 on the side of recoding layer 87 into close contact with the surface of master substrate 90 on the side of magnetic layer 92 and applying transfer field Hdu in a direction perpendicular to the track surface of magnetic disk medium 85 and opposite to the direction of initial DC field Hin. As the result, the transfer field is drawn into magnetic layer 92 of master substrate 90 and the magnetization of magnetic layer 87 of magnetic recording medium 85 at the portions corresponding to the convex portions of magnetic layer 92 of master substrate 90 is reversed, while the magnetization of the other portions is not reversed. Consequently, information (e.g., servo signal) corresponding to the uneven pattern of master substrate 90 is magnetically transfer recorded on magnetic recording layer 87 of magnetic disk medium 85. Note that, when performing magnetic transfer also to the upper side recording layer of magnetic disk medium 85, the magnetic transfer is performed at the same time with the magnetic transfer of the lower side recording layer by bringing the upper side recording layer and an upper side master substrate into close contact with each other.

In the case of magnetic transfer to a longitudinal magnetic recording medium, master substrate 90 which is substantially the same as that used for the vertical magnetic recording medium is used. For the longitudinal recording medium, the magnetic disk medium is DC-magnetized along a track direction in advance. Then magnetic transfer is performed by bringing the magnetic disk medium into close contact with the master substrate and applying a transfer field in the direction opposite to that of the initial DC magnetization. The transfer magnetic field is drawn into convex portions of the magnetic layer of the master substrate 90 resulting in that the magnetization of the portions of the magnetic layer of the magnetic disk medium corresponding to the convex port ions is not reversed while the magnetization of the other portions is reversed. In this way, a magnetic pattern corresponding to the uneven pattern may be recorded on the magnetic disk medium.

The above described manufacturing method of the imprint mold or magnetic transfer master substrate using the electron beam writing method of the present invention is illustrative only. The method is not limited to this and any method may be used as long as it has a process of writing a fine pattern to form an uneven pattern using the electron beam writing method of the present invention.

What is claimed is:

1. An electron beam writing method for writing a fine pattern on a substrate applied with a resist and placed on a rotation stage by scanning an electron beam on the substrate while rotating the rotation stage, the fine pattern including elements having a track direction length greater than an emission diameter of the electron beam, wherein:

while rotating the substrate in one direction, ON/OFF control is performed with respect to the rotation of the substrate for emitting the electron beam at a predetermined rotational position of the substrate by a blanking-OFF signal, performing writing in a rotational direction of the substrate along with the rotation of the substrate, and terminating the writing by a blanking-ON signal based on write data of the fine pattern to perform writing for one round, and the writing based on the ON/OFF control is repeated by moving the electron beam or the substrate in a radial direction of the substrate, whereby the elements are written; and rotation control is performed for controlling the rotation speed of the rotation stage so as to be increased for inner track writing and decreased for outer track writing inversely proportional to the radius of the writing position in order to maintain the linear velocity of the rotation stage constant.

2. The electron beam writing method as claimed in claim 1, wherein the write control signal of the electron beam is formed based on a writing clock signal generated in association with the rotation of the rotation stage, and the number of clocks of the writing clock signal in one rotation of the rotation stage is set to a constant value for each track regardless of the radius of the writing position.

3. The electron beam writing method as claimed in claim 1, wherein the fine pattern is written by writing the elements, while rotating the substrate in the one direction, by vibrating the electron beam back and forth in a radial direction of the rotation stage and emitting the electron beam at the predetermined rotational position of the substrate along with the rotation of the substrate by the ON/OFF control.

4. The electron beam writing method as claimed in claim 1, wherein the fine pattern is written by writing the elements, while rotating the substrate in the one direction, by fixing the electron beam at a predetermined radial position of the substrate and emitting the electron beam at the predetermined rotational position of the substrate by the ON/OFF control, and repeating the emission of the electron beam by the ON/OFF control by moving the emission position of the electron beam in the radial direction in a next rotation of the substrate.

5. A fine pattern writing system for realizing the electron beam writing method as claimed in claim 1, comprising a signal output unit for outputting a write data signal, and an electron beam writing unit for scanning an electron beam.

6. The fine pattern writing system as claimed in claim 5, wherein:
   the electron beam writing unit includes a rotation stage movable in a radial direction while rotating a substrate applied with a resist, an electron gun that emits an electron beam, a deflection means that deflects the electron beam in a radial direction of the rotation stage, a blanking means that performs ON/OFF control of the electron beam in which the emission of the electron beam is blocked other than a writing area, and a controller that performs associated control of operation of each of the means; and
   the signal output unit is a unit that outputs a write data signal to the controller of the electron beam writing unit based on data corresponding to the form of a fine pattern to be written on the substrate, and wherein
   the controller is a controller that performs rotation control for controlling the rotation speed of the rotation stage so as to be increased for inner track writing and decreased for outer track writing inversely proportional to the radius of the writing position, and performs control for the deflection means and the blanking means based on a writing clock signal formed such that the number of clocks in one rotation of the rotation stage becomes a constant value for each track regardless of the radius of the writing position.

7. A method for manufacturing an uneven pattern carrying substrate, comprising the steps of:
   writing a desired fine pattern on a substrate applied with a resist by the electron beam writing method as claimed in claim 1; and
   forming thereon an uneven pattern corresponding to the desired fine pattern.

8. A method for manufacturing a magnetic disk medium, wherein the method uses an imprint mold produced through the steps of writing a desired fine pattern on a substrate applied with a resist by the electron beam writing method as claimed in claim 1 and forming an uneven pattern corresponding to the desired fine pattern on the substrate to transfer an uneven pattern corresponding to the uneven pattern provided on the surface of the mold to the magnetic disk medium.

9. A method for manufacturing a magnetic disk medium, wherein the method uses a magnetic transfer master substrate produced through the steps of writing a desired fine pattern on a substrate applied with a resist by the electron beam writing method as claimed in claim 1 and forming an uneven pattern corresponding to the desired fine pattern on the substrate to transfer a magnetic pattern corresponding to the uneven pattern provided on the surface of the master substrate to the magnetic disk medium.

* * * * *